United States Patent
Kim et al.

(10) Patent No.: US 11,455,952 B2
(45) Date of Patent: Sep. 27, 2022

(54) DISPLAY APPARATUS

(71) Applicant: SAMSUNG DISPLAY CO., LTD., Yongin-si (KR)

(72) Inventors: Keunwoo Kim, Yongin-si (KR); Doona Kim, Yongin-si (KR); Sangsub Kim, Yongin-si (KR); Dokyeong Lee, Yongin-si (KR); Jaehwan Chu, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 9 days.

(21) Appl. No.: 17/084,142

(22) Filed: Oct. 29, 2020

(65) Prior Publication Data
US 2021/0335242 A1    Oct. 28, 2021

(30) Foreign Application Priority Data
Apr. 27, 2020 (KR) .................. 10-2020-0051050

(51) Int. Cl.
G09G 3/3233 (2016.01)
H01L 51/00 (2006.01)
H01L 27/32 (2006.01)

(52) U.S. Cl.
CPC ... G09G 3/3233 (2013.01); *G09G 2300/0421* (2013.01); *G09G 2300/0426* (2013.01); *G09G 2300/0842* (2013.01); *G09G 2300/0861* (2013.01); *G09G 2310/0202* (2013.01); *G09G 2320/0233* (2013.01); *H01L 27/3265* (2013.01); *H01L 51/0097* (2013.01)

(58) Field of Classification Search
None
See application file for complete search history.

(56) References Cited

U.S. PATENT DOCUMENTS 9,478,169 B2    10/2016  Lim et al.
11,257,429 B2*  2/2022   Jeong .................. G09G 3/3233
2013/0069068 A1* 3/2013  Miyake ................ H01L 27/124
                                               257/E27.12

(Continued)

FOREIGN PATENT DOCUMENTS

CN        108154846      6/2018
KR     10-2016-0044078    4/2016

(Continued)

OTHER PUBLICATIONS

Kim, et al., "Double-Gate CMOS: Symmetrical-Versus Asymmetrical-Gate Devices", IEEE Transactions on Electron Devices, vol. 48, No. 2, Feb. 2001, pp. 294-299.

*Primary Examiner* — Dorothy Harris
(74) *Attorney, Agent, or Firm* — F. Chau & Associates, LLC

(57) ABSTRACT

A display apparatus includes a first thin-film transistor including a semiconductor layer arranged on a substrate, a driving gate electrode arranged on the semiconductor layer, and a first electrode arranged between the substrate and the semiconductor layer, a second thin-film transistor transmitting a data signal received through a data line to the first thin-film transistor according to a first scan signal received through a first scan line, and a third thin-film transistor transmitting a first voltage to the first electrode according to a second scan signal received through a second scan line.

20 Claims, 9 Drawing Sheets

(56) References Cited

U.S. PATENT DOCUMENTS

| | | | | |
|---|---|---|---|---|
| 2014/0034923 A1* | 2/2014 | Kim | ................... | H01L 27/3265 |
| | | | | 257/40 |
| 2015/0171156 A1* | 6/2015 | Miyake | ............... | G09G 3/3233 |
| | | | | 257/43 |
| 2017/0337875 A1* | 11/2017 | Jeon | ................... | H01L 27/1225 |
| 2018/0102397 A1* | 4/2018 | Nie | ...................... | G09G 3/3233 |
| 2019/0362674 A1* | 11/2019 | Xu | ........................... | G09G 3/32 |
| 2020/0005708 A1* | 1/2020 | Hwang | ............... | G09G 3/3258 |
| 2020/0118508 A1* | 4/2020 | Park | ................... | H01L 27/1255 |
| 2021/0020662 A1* | 1/2021 | Ishida | .............. | H01L 29/78648 |

FOREIGN PATENT DOCUMENTS

| | | |
|---|---|---|
| KR | 10-2016-0074772 | 6/2016 |
| KR | 10-2020-0000513 | 1/2020 |
| KR | 10-2020-0002050 | 1/2020 |

\* cited by examiner

DISPLAY APPARATUS

CROSS-REFERENCE TO RELATED APPLICATION

This application claims the benefit of Korean Patent Application No. 10-2020-0051050, filed on Apr. 27, 2020, in the Korean Intellectual Property Office, the disclosure of which is incorporated by reference herein in its entirety.

1. Field

One or more embodiments relate to a display apparatus, and more particularly, to a display apparatus having increased visibility.

2. Description of the Related Art

Display apparatuses visually display data. Display apparatuses are used as displays in small products, such as mobile phones, and are also used as displays in large products, such as televisions.

Display apparatuses include a plurality of pixels that receive electrical signals and emit light to display an image to the outside. Each of the plurality of pixels includes a light-emitting device. For example, in the case of organic light-emitting display apparatuses, each pixel includes an organic light-emitting diode (OLED) as a light-emitting device. In general, organic light-emitting display apparatuses include thin film transistors and OLEDs formed on a substrate, and the OLEDs emit light.

Applications of display apparatuses have been diversified, and also various design efforts for quality improvement of display apparatuses have been made.

SUMMARY

Conventional display apparatuses generate a bright defect due to a kink effect when a low grayscale is realized.

One or more embodiments include a display apparatus capable of addressing generation of a bright defect by preventing a kink effect from occurring during realization of a low grayscale and at the same time improving panel characteristics, by including a first electrode used as a bottom gate by a driving thin-film transistor. However, the one or more embodiments are only examples, and the scope of the disclosure is not limited thereto.

Additional aspects will be set forth in part in the description which follows and, in part, will be apparent from the description, or may be learned by practice of the presented embodiments of the disclosure.

According to one or more embodiments, a display apparatus includes a first thin-film transistor including a semiconductor layer arranged on a substrate, a driving gate electrode arranged on the semiconductor layer, and a first electrode arranged between the substrate and the semiconductor layer, a second thin-film transistor configured to transmit a data signal received through a data line to the first thin-film transistor according to a first scan signal received through a first scan line, and a third thin-film transistor configured to transmit a first voltage to the first electrode according to a second scan signal received through a second scan line.

The first voltage may be a voltage corresponding to a voltage difference between the data signal and a threshold voltage of the first thin-film transistor.

The driving gate electrode and the first electrode may overlap each other with the semiconductor layer between the driving gate electrode and the first electrode.

The first electrode may be connected to the third thin-film transistor.

The first thin-film transistor may further include a driving source electrode and a driving drain electrode, and the second thin-film transistor may further include a switching gate electrode, a switching source electrode, and a switching drain electrode.

The switching gate electrode of the second thin-film transistor may be connected to the first scan line, the switching source electrode of the second thin-film transistor may be connected to the data line, and the switching drain electrode of the second thin-film transistor may be connected to the driving source electrode of the first thin-film transistor.

The second thin-film transistor may be turned on according to the first scan signal and transmit the data signal received through the data line to the driving source electrode of the first thin-film transistor.

The display apparatus may further include a fourth thin-film transistor turned on according to the first scan signal to diode-connect the driving gate electrode of the first thin-film transistor to the driving drain electrode of the first thin-film transistor.

The fourth thin-film transistor may be connected to the third thin-film transistor.

The display apparatus may further include a first storage capacitor, the first storage capacitor including the gate electrode and an upper electrode overlapping the driving gate electrode with an insulating layer between the upper electrode and the driving gate electrode.

The display apparatus may further include a second electrode interposed between the first electrode and the semiconductor layer of the first thin-film transistor.

The second electrode may be spaced apart from the driving gate electrode.

The display apparatus may further include a barrier layer arranged on the substrate, and a buffer layer arranged on the barrier layer, wherein the first electrode may be directly on the barrier layer.

The buffer layer may include a first buffer layer arranged on the barrier layer and a second buffer layer arranged on the first buffer layer. The second electrode is directly on the first buffer layer.

The first electrode and the second electrode may at least partially overlap each other.

A portion of the first buffer layer may be interposed between the first electrode and the second electrode to form a second storage capacitor having the first electrode and the second electrode with the portion of the first buffer layer.

The second storage capacitor and the first thin-film transistor may overlap each other.

The first buffer layer and the second buffer layer may include different materials.

The substrate may include polyimide (PI).

According to one or more embodiments, a display apparatus includes a first thin-film transistor including a semiconductor layer arranged on a substrate, a driving gate electrode arranged on the semiconductor layer, and a first electrode arranged between the substrate and the semiconductor layer, a second thin-film transistor configured to transmit a data signal received through a data line to the first thin-film transistor according to a first scan signal received through a first scan line, a third thin-film transistor configured to transmit a voltage corresponding to a voltage difference between the data signal and a threshold voltage of the first thin-film transistor to the first electrode according to a second scan signal received through a second scan line, and an organic light-emitting diode electrically connected to the first thin-film transistor and including a pixel electrode, an intermediate layer, and an opposite electrode.

These and/or other aspects will become apparent and more readily appreciated from the following description of the embodiments, the claims, and the accompanying drawings.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF EXEMPLARY EMBODIMENTS

Figure 1:
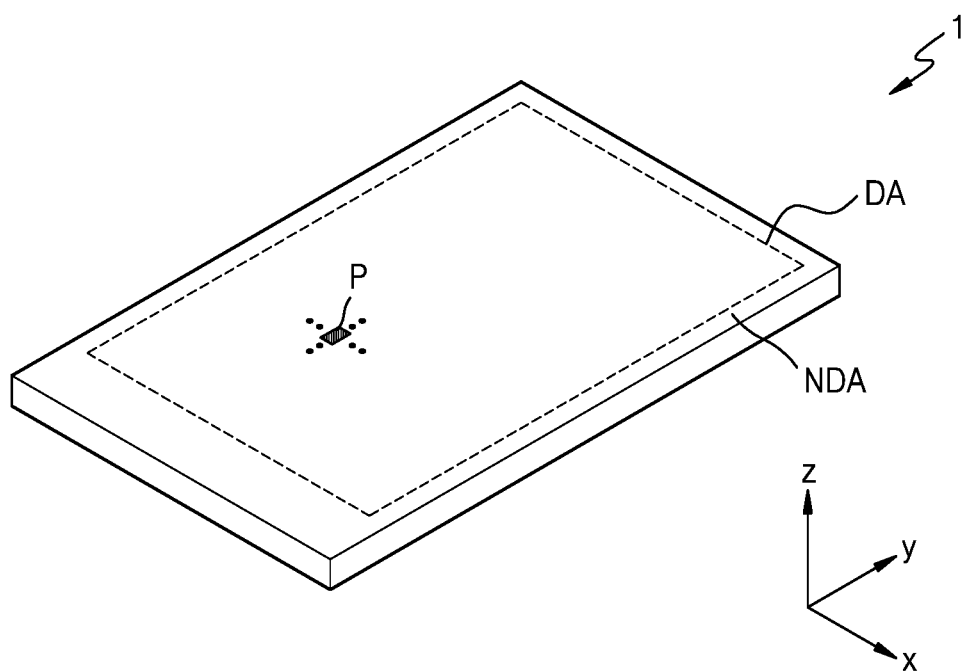
FIG. 1 is a schematic perspective view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. Hereinafter, effects and features of the present disclosure and a method for accomplishing them will be described more fully with reference to the accompanying drawings, in which embodiments of the disclosure are shown. This disclosure may, however, be embodied in many different forms and should not be construed as limited to the embodiments set forth herein.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. For example, since sizes and thicknesses of components in the drawings are arbitrarily illustrated for convenience of explanation, the following embodiments are not limited thereto.

In the present specification, "A and/or B" represents A or B, or A and B. The expression "at least one of A and B" indicates only A, only B, both A and B, or variations thereof.

In the following embodiments, the meaning that a wire extends in a first direction or a second direction encompasses not only extending in a straight line but also extending in zigzags or in a curve in the first direction or the second direction.

In the following embodiments, when referred to "planar", it means when an object is viewed from above, and when referred to "sectional", it means when a cross section formed by vertically cutting an object is viewed from the side. In the following embodiments, when referred to "overlapping", it encompasses "planar" overlapping or "cross-sectional" overlapping.

One or more embodiments of the disclosure will be described below in more detail with reference to the accompanying drawings. Those components that are the same or are in correspondence may be referred to using the same reference numeral regardless of the figure number.

FIG. 1 is a schematic perspective view of a display apparatus 1 according to an embodiment.

Referring to FIG. 1, the display apparatus 1 may include a display area DA and a non-display area NDA around the display area DA. The non-display area NDA may surround the display area DA. The display apparatus 1 may provide an image by using light emitted by a plurality of pixels P arranged in the display area DA. In the non-display area NDA, no images may be displayed.

Although an organic light-emitting display will now be illustrated and described as the display apparatus 1, display apparatuses according to embodiments are not limited thereto. According to an embodiment, the display apparatus 1 may be an inorganic light-emitting display, a quantum dot light-emitting display, or the like. For example, an emission layer of a display element included in the display apparatus 1 may include an organic material, an inorganic material, quantum dots, an organic material and quantum dots, or an inorganic material and quantum dots.

Although FIG. 1 illustrates a display apparatus 1 including a flat display surface, embodiments of the disclosure are not limited thereto. According to an embodiment, the display apparatus 1 may include a three-dimensional display surface or a curved display surface.

When the display apparatus 1 includes a three-dimensional display surface, the display apparatus 1 may include a plurality of display areas pointing different directions, and, for example, may include a display surface in the form of a polyprism. According to an embodiment, when the display apparatus 1 includes a curved display surface, the display apparatus 1 may be implemented in various shapes including flexible, foldable, and rollable display apparatuses.

FIG. 1 illustrates the display apparatus 1 that may be applied to mobile phones. Although now shown, electronic modules, a camera module, a power supply module, and the like mounted on a main board may be arranged in a bracket/case or the like together with the display apparatus 1, thereby constituting a mobile phone. In particular, the display apparatus 1 is applicable to not only large-sized electronic apparatuses, such as televisions and monitors, but also small- and medium-sized electronic apparatuses, such as tablets, automobile navigation devices, game players, smart watches, etc.

In FIG. 1, the display area DA of the display apparatus 1 is rectangular. However, the shape of the display area DA may be a circle, an oval, or a polygon such as a triangle or a pentagon.

The display apparatus 1 includes a plurality of pixels P arranged in the display area DA. Each of the plurality of pixels P may include an organic light-emitting diode OLED. Each of the plurality of pixels P may emit, for example, red light, green light, blue light, or white light, from the organic light-emitting diode OLED. A pixel P used herein may be understood as a pixel that emits one of red light, green light, blue light, and white light as described above.

Figure 2:
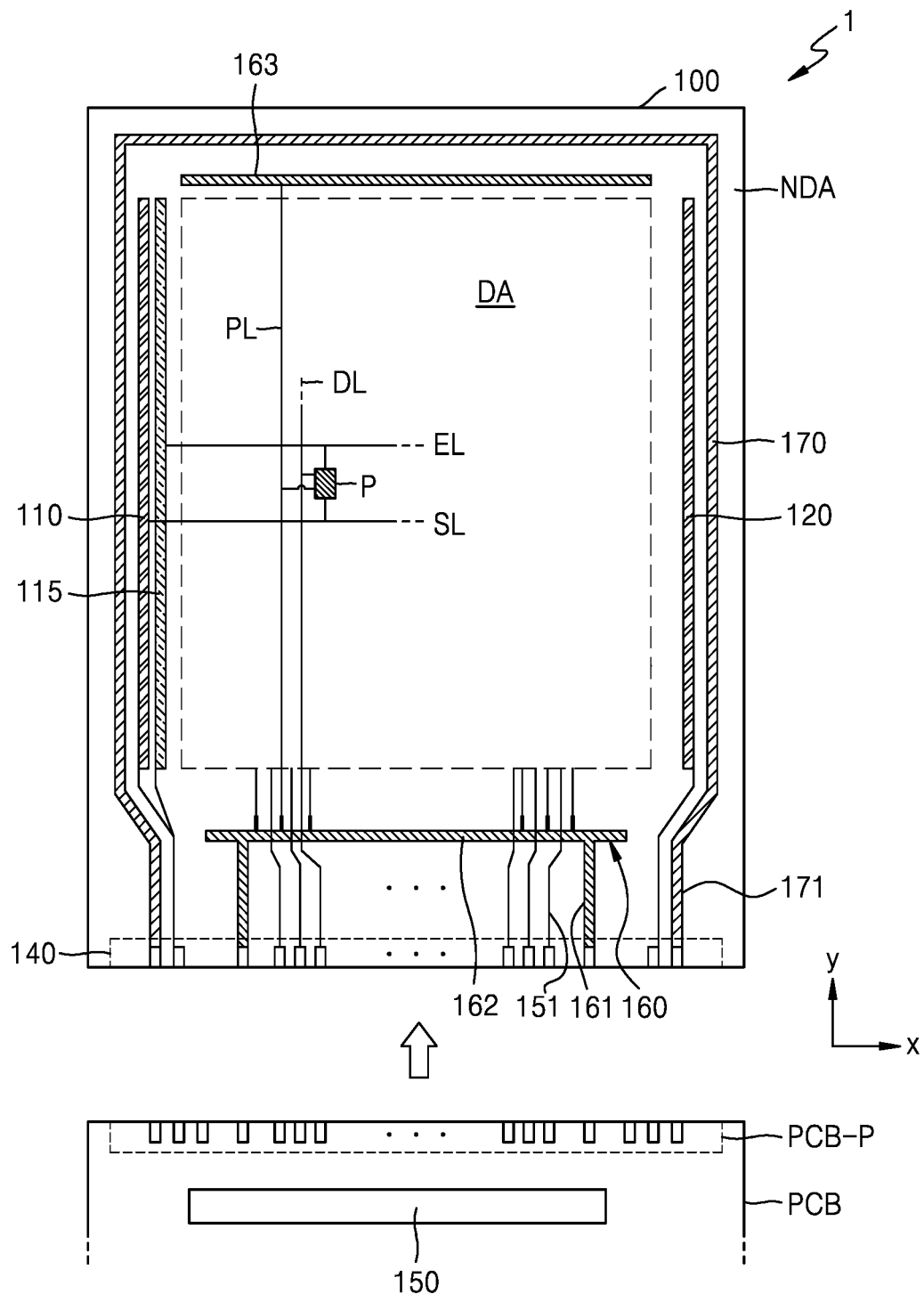
FIG. 2 is a schematic plan view of a display apparatus according to an embodiment.

FIG. 2 is a schematic plan view of the display apparatus 1 according to an embodiment.

Referring to FIG. 2, the display apparatus 1 includes a plurality of pixels P arranged in the display area DA. Each of the plurality of pixels P may include a display element, such as an organic light-emitting diode OLED Each of the plurality of pixels P may emit, for example, red light, green light, blue light, or white light, from the organic light-emitting diode OLED. The pixel P used herein may be understood as a pixel that emits one of red light, green light, blue light, and white light as described above.

Each of the plurality of pixels P may be electrically connected to outer circuits arranged in the non-display area NDA. A first scan driving circuit 110, a first light-emission driving circuit 115, a second scan driving circuit 120, a terminal 140, a data driving circuit 150, a first power supply line 160, and a second power supply line 170 may be arranged in the non-display area NDA.

The first scan driving circuit 110 may provide a scan signal to each of the plurality of pixels P via a scan line SL. The first light-emission driving circuit 115 may provide a light-emission control signal to each of the plurality of pixels P via a light-emission control line EL. The second scan driving circuit 120 may be juxtaposed with the first scan driving circuit 110 with the display area DA therebetween. The first scan driving circuit 110 and the second scan driving circuit 120 may be disposed on opposite sides of the display area DA, respectively. Some of the plurality of pixels P arranged in the display area DA may be electrically connected to the first scan driving circuit 110, and the remaining ones of the pixels P may be electrically connected to the second scan driving circuit 120. According to an embodiment, the second scan driving circuit 120 may be omitted.

The first light-emission driving circuit 115 may be arranged on the non-display area NDA to be spaced apart from the first scan driving circuit 110 in an x direction. The first light-emission driving circuit 115 may alternate with the first scan driving circuit 110 in a y direction.

The terminal 140 may be on one side of the substrate 100. The terminal 140 may be exposed by not being covered by an insulating layer, and may be electrically connected to a printed circuit board PCB. A terminal PCB-P of the printed circuit board PCB may be electrically connected to the terminal 140 of the display apparatus 1. The printed circuit board PCB transmits a signal or power of a controller (not shown) to the display apparatus 1. A control signal generated by the controller may be transmitted to each of the first scan driving circuit 110, the first light-emission driving circuit 115, and the second scan driving circuit 120 via the printed circuit board PCB. The controller may provide a first power supply voltage ELVDD and a second power supply voltage ELVSS to the first and second power supply lines 160 and 170 via first and second connection lines 161 and 171, respectively. The first power supply voltage ELVDD may be provided to each of the plurality of pixels P (e.g., a pixel electrode of an OLED in each pixel) via a driving voltage line PL connected to the first power supply line 160, and the second power supply voltage ELVSS may be provided to an opposite electrode of each of the plurality of pixels P (e.g., an opposite electrode of the OLED in each pixel) connected to the second power supply line 170.

The data driving circuit 150 is electrically connected to a data line DL. A data signal of the data driving circuit 150 may be provided to each of the plurality of pixels P via a connection line 151 connected to the terminal 140 and the data line DL connected to the connection line 151.

FIG. 2 illustrates an arrangement of the data driving circuit 150 on the printed circuit board PCB. However, according to an embodiment, the data driving circuit 150 may be arranged on the substrate 100. For example, the data driving circuit 150 may be between the terminal 140 and the first power supply line 160.

The first power supply line 160 may include a first sub-wire 162 and a second sub-wire 163 each extending in the x direction and being parallel to each other and spaced apart from each other with the display area DA therebetween. The second power supply line 170 may partially surround the display area DA by having a loop shape of which one side is open.

Figure 3:
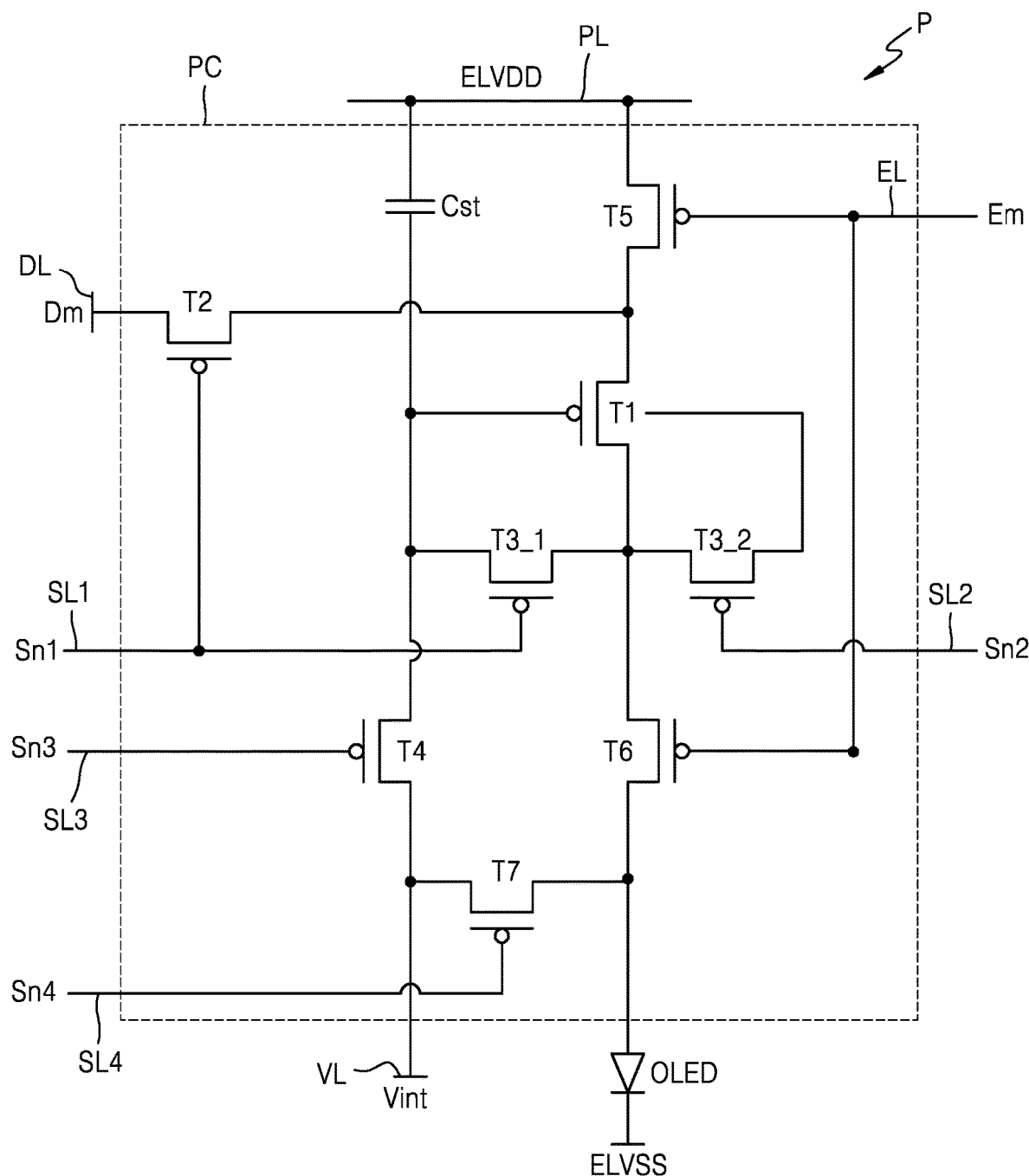
FIG. 3 is an equivalent circuit diagram of a pixel of a display apparatus according to an embodiment.
Figure 4:
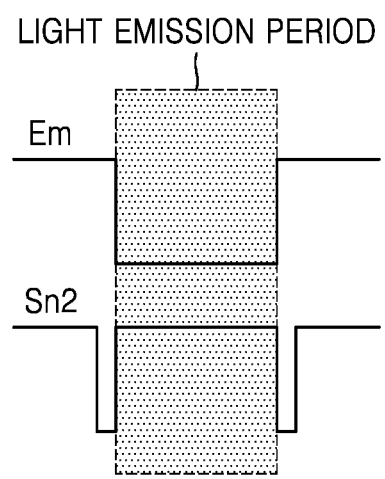
FIG. 4 is a view for explaining a sequence in which a light-emission control signal and a second scan signal of a display apparatus according to an embodiment are provided.
Figure 5:
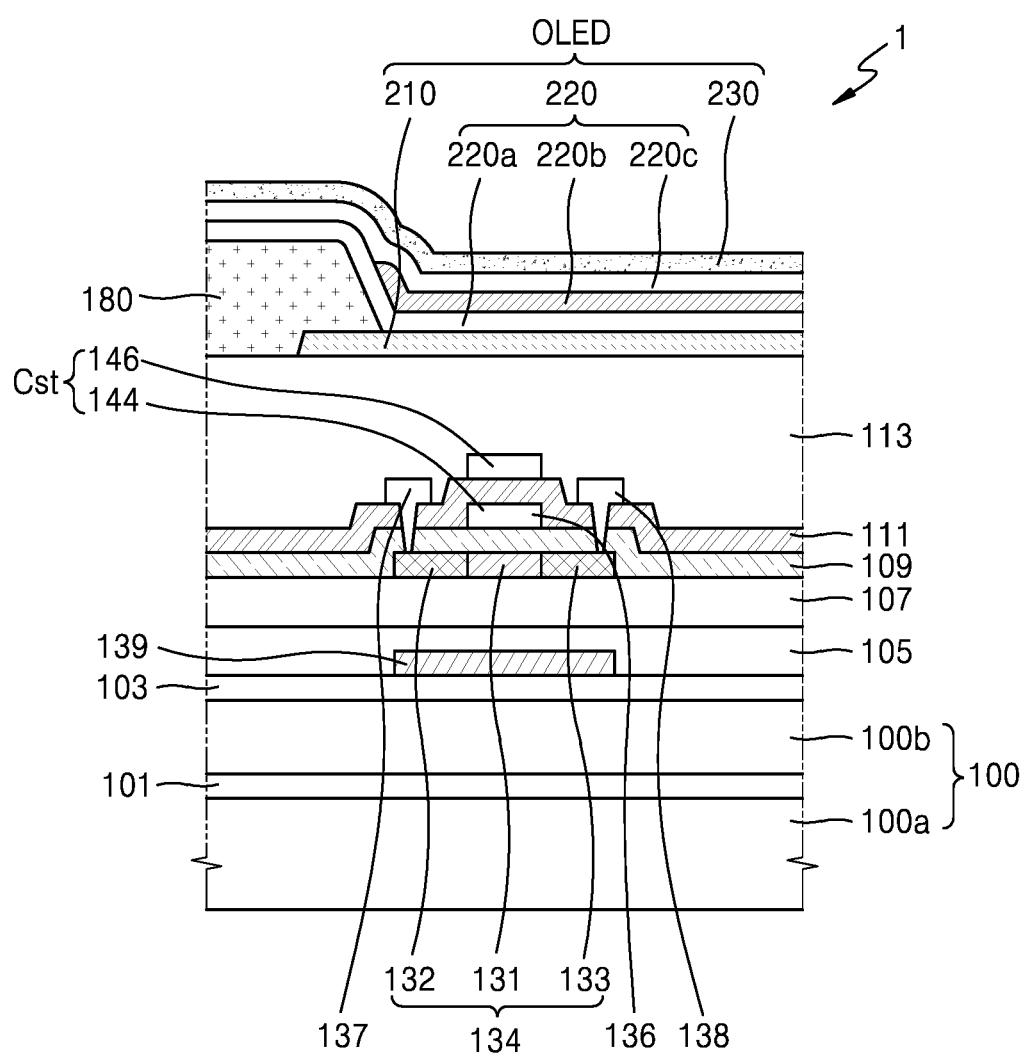
FIG. 5 is a schematic cross-sectional view of a display apparatus according to an embodiment.

FIG. 3 is an equivalent circuit diagram of a pixel of a display apparatus according to an embodiment, FIG. 4 is a view for explaining a sequence in which a light-emission control signal and a second scan signal of the display apparatus according to an embodiment are provided, and FIG. 5 is a schematic cross-sectional view of the display apparatus according to an embodiment.

Referring to FIGS. 3 and 5, a pixel circuit PC of the display apparatus according to an embodiment may include a plurality of thin-film transistors T1 through T7 and a storage capacitor Cst. For example, the pixel circuit PC may include a driving thin-film transistor T1, a switching thin-film transistor T2, a first compensating thin-film transistor T3_1, a second compensating thin-film transistor T3_2, a first initializing thin-film transistor T4, an operation control thin-film transistor T5, a light-emission control thin-film transistor T6, a second initializing thin-film transistor T7, and the storage capacitor Cst.

Although each pixel circuit PC includes signal lines, namely, first, second, third, and fourth scan lines SL1, SL2, SL3, and SL4, a light-emission control line EL, and a data line DL, an initializing voltage line VL, and a driving voltage line PL in FIG. 3, embodiments are not limited thereto. According to another embodiment, at least one of the signal lines, namely, the first, second, third, and fourth scan lines SL1, SL2, SL3, and SL4, the light-emission control line EL, and the data line DL, or/and the initializing voltage line VL, may be shared by neighboring pixel circuits.

The first scan line SL1 may be configured to transmit a first scan signal Sn1 to the switching thin-film transistor T2 and the first compensating thin-film transistor T3_1, the second scan line SL2 may be configured to transmit a second scan signal Sn2 to the second compensating thin-film transistor T3_2, the third scan line SL3 may be configured to transmit a third scan signal Sn3 to the first initializing thin-film transistor T4, and the fourth scan line SL4 may be configured to transmit a fourth scan signal Sn4 to the second initializing thin-film transistor T7. The light-emission control line EL may be configured to transmit a light-emission control signal Em to the operation control thin-film transistor T5 and the light-emission control thin-film transistor T6, the data line DL may intersect with the light-emission control line EL and the scan line SL and may be configured to transmit a data signal Dm, the driving voltage line PL may be configured to transmit a driving voltage ELVDD to the driving thin-film transistor T1, and the initializing voltage line VL may be configured to transmit an initializing voltage Vint to the first initializing thin-film transistor T4 and the second initializing thin-film transistor T7.

The driving thin-film transistor T1 includes a driving gate electrode connected to a lower electrode of the storage capacitor Cst, a driving source electrode connected to the driving voltage line PL via the operation control thin-film transistor T5, and a driving drain electrode electrically connected to a pixel electrode 210 of the organic light-emitting diode OLED via the light-emission control thin-film transistor T6. The driving thin-film transistor T1 may receive the data signal Dm according to a switching operation of the switching thin-film transistor T2 and may supply a driving current $I_{OLED}$ to the organic light-emitting diode OLED.

The switching thin-film transistor T2 includes a switching gate electrode connected to the first scan line SL1, a switching source electrode connected to the data line DL, and a switching drain electrode connected to the driving source electrode of the driving thin-film transistor T1 and also connected to the driving voltage line PL via the operation control thin-film transistor T5. The switching thin-film transistor T2 may be turned on according to the first scan signal Sn1 received via the first scan line SL1 and may perform a switching operation of transmitting the data signal Dm received from the data line DL to the driving source electrode of the driving thin-film transistor T1.

The first compensating thin-film transistor T3_1 includes a first compensating gate electrode connected to the first scan line SL_1, and a first compensating source electrode connected to the pixel electrode 210 of the organic light-emitting diode OLED via the light-emission control thin-film transistor T6 and a second compensating source electrode of the second compensating thin-film transistor T3_2. A second compensating drain electrode of the second compensating thin-film transistor T3_2 is connected to a first electrode 139, which will be described with reference to FIG. 5, of the driving thin film transistor T1. The first compensating thin-film transistor T3_1 further includes a first compensating drain electrode connected to the lower electrode of the storage capacitor Cst, a first initializing drain electrode of the first initializing thin-film transistor T4, and the driving gate electrode of the driving thin-film transistor T1. The first compensating thin-film transistor T3_1 may be turned on according to the first scan signal Sn1 received via the first scan line SL1 and may electrically connect the driving gate electrode and the driving drain electrode of the driving thin-film transistor T1 to each other, such that the driving thin-film transistor T1 is diode-connected.

The second compensating thin-film transistor T3_2 includes a second compensating gate electrode connected to the second scan line SL2, and a second compensating source electrode connected to the pixel electrode 210 of the organic light-emitting diode OLED via the light-emission control thin-film transistor T6 and the first compensating source electrode of the first compensating thin-film transistor T3_1. The second compensating thin-film transistor T3_2 includes the second compensating drain electrode connected to the first electrode 139 of the driving thin-film transistor T1, which will be described later. The second compensating thin-film transistor T3_2 may be turned on according to the second scan signal Sn2 received via the second scan line SL2 and may be configured transmit a first voltage to the first electrode 139 of the driving thin-film transistor T1. The first voltage may be a voltage corresponding to a voltage difference between the data signal Dm and a threshold voltage of the driving thin-film transistor T1.

The first initializing thin-film transistor T4 includes a first initializing gate electrode connected to the third scan line SL3, a first initializing source electrode connected to the initializing voltage line VL, and the first initializing drain electrode connected to the lower electrode of the storage capacitor Cst, the first compensating drain electrode of the first compensating thin-film transistor T3_1, and the driving gate electrode of the driving thin-film transistor T1. The first initializing thin-film transistor T4 may be turned on according to the third scan signal Sn3 received via the third scan line SL3 and may transmit an initializing voltage Vint to the driving gate electrode of the driving thin-film transistor T1 to thereby initialize a voltage of the driving gate electrode of the driving thin-film transistor T1.

The operation control thin-film transistor T5 includes an operation control gate electrode connected to the light-emission control line EL, an operation control source electrode connected to the driving voltage line PL, and an operation control drain electrode connected to the driving source electrode of the driving thin-film transistor T1 and the switching drain electrode of the switching thin-film transistor T2.

The light-emission control thin-film transistor T6 includes a light-emission control gate electrode connected to the light-emission control line EL, a light-emission control source electrode connected to the driving drain electrode of the driving thin-film transistor T1 and the first compensating source electrode of the first compensating thin-film transistor T3_1, and a light-emission control drain electrode electrically connected to a second initializing source electrode of the second initializing thin-film transistor T7 and the pixel electrode 210 of the organic light-emitting diode OLED.

The operation control thin-film transistor T5 and the light-emission control thin-film transistor T6 are simultaneously turned on according to the light-emission control signal Em received via the light-emission control line EL, and thus the driving voltage ELVDD is transmitted to the organic light-emitting diode OLED such that the driving current $I_{OLED}$ may flow in the organic light-emitting diode OLED.

Referring to FIG. 4, the light-emission control signal Em may be transmitted to the operation control thin-film transistor T5 and the light-emission control thin-film transistor T6 in a light-emission period of the organic light-emitting diode OLED, and the second scan signal Sn2 may be transmitted to the second compensating thin-film transistor T3_2 in a time period other than the light-emission period.

In the light-emission period, the operation control thin-film transistor T5 and the light-emission control thin-film transistor T6 may be turned on according to the light-emission control signal Em, and thus, a driving voltage ELVDD may be transmitted to the organic light-emitting diode OLED, such that the driving current $I_{OLED}$ may flow in the organic light-emitting diode OLED.

In a time period other than the light-emission period, the second compensating thin-film transistor T3_2 may be turned on by the second scan signal Sn2 transmitted to the second compensating thin-film transistor T3_2, and the above-described first voltage may be transmitted to the first electrode 139 of the driving thin-film transistor T1. In an example embodiment, a time period during which the operation control thin-film transistor T5 and the light-emission control thin-film transistor T6 turn on does not overlap a time period during which the second compensating thin-film transistor T3_2 turns on.

Referring back to FIG. 3, the second initializing thin-film transistor T7 includes a second initializing gate electrode connected to the fourth scan line SL4, the second initializing source electrode S7 connected to the light-emission control drain electrode of the light-emission control thin-film transistor T6 and the pixel electrode 210 of the organic light-emitting diode OLED, and the second initializing drain electrode connected to the initializing voltage line VL. The second initializing thin-film transistor T7 may be turned on according to the fourth scan signal Sn4 received via the fourth scan line SL4 and may initialize the pixel electrode 210 of the organic light-emitting diode OLED.

The first scan line SL1 and the fourth scan line SL4 may be electrically connected to each other such that the same scan signal Sn may be applied to the first scan line SL1 and the fourth scan line SL4.

An upper electrode of the storage capacitor Cst is connected to the driving voltage line PL, and an opposite electrode of the organic light-emitting diode OLED is connected to a common voltage ELVSS. Accordingly, the organic light-emitting diode OLED may receive the driving current $I_{OLED}$ from the driving thin-film transistor T1 and emits light, thereby displaying an image.

A structure in which the components included in the display apparatus according to an embodiment are stacked will now be described with reference to FIG. 5.

Referring to FIG. 5, a substrate 100 may include a first substrate 100a and a second substrate 100b. For example, the first substrate 100a and the second substrate 100b may include polymer resin such as polyethersulphone, polyacrylate, polyetherimide, polyethylene naphthalate, polyethylene terephthalate, polyphenylene sulfide, polyarylate, polycarbonate, or cellulose acetate propionate. The first substrate 100a and the second substrate 100b including polymer resin may be flexible, rollable, or bendable. In an example embodiment, the first substrate 100a and the second substrate 100b may include the same material such as polyimide. A first barrier layer 101 may be on the first substrate 100a, and a second barrier layer 103 may be on the second substrate 100b. In an example embodiment, the first barrier layer 101 may be interposed between the first substrate 100a and the second barrier layer 103. In an example embodiment, the second substrate 100b may be interposed between the first barrier layer 101 and the second barrier layer 103. The first barrier layer 101 and the second barrier layer 103 may prevent gas discharged from the first substrate 100a or the second substrate 100b from being transmitted to the top or another layer formed during a process. According to another embodiment, the substrate 100 may include glass.

A first thin-film transistor may be on the substrate 100. For example, the first thin-film transistor may be the driving thin-film transistor T1 of FIG. 3. The first thin-film transistor may include the first electrode 139, a semiconductor layer 134, a driving gate electrode 136, a driving source electrode 137, and a driving drain electrode 138.

A buffer layer may be on the substrate 100. The buffer layer may be on the second barrier layer 103. The buffer layer may include a first buffer layer 105 and a second buffer layer 107. The first buffer layer 105 and the second buffer layer 107 may reduce or block permeation of foreign materials, humid, or ambient air from the bottom. The first and second buffer layers 105 and 107 may include an inorganic material (such as oxide or nitride), an organic material, or an organic and inorganic compound, and may be a single layer or multiple layers of an inorganic material and an organic material. According to an embodiment, the first buffer layer 105 and the second buffer layer 107 may include different materials. For example, the first buffer layer 105 may include silicon nitride ($SiN_x$), and the second buffer layer 107 may include silicon oxide ($SiO_x$). According to another embodiment, the first buffer layer 105 and the second buffer layer 107 may include the same material as each other. For example, both the first buffer layer 105 and the second buffer layer 107 may include silicon nitride ($SiN_x$) or both the first buffer layer 105 and the second buffer layer 107 may include silicon oxide ($SiO_x$).

The first electrode 139 may be arranged between the second barrier layer 103 and the first buffer layer 105. The first electrode 139 may be used as a bottom gate electrode of the first thin-film transistor.

The semiconductor layer 134 may be on the second buffer layer 107. The semiconductor layer 134 may include a channel region 131 that is overlapped by the driving gate electrode 136, and a source region 132 and a drain region 133 disposed on opposite sides of the channel region 131, respectively, and including a higher concentration of impurities than the channel region 131. The impurities may include N-type impurities or P-type impurities. The source region 132 and the drain region 133 may be electrically connected to the driving source electrode 137 and the driving drain electrode 138, respectively.

The semiconductor layer 134 may include an oxide semiconductor and/or a silicon semiconductor. The semiconductor layer 134 may include oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). For example, the semiconductor layer 134 may be InSnZnO (ITZO), InGaZnO (IGZO), or the like. When the semiconductor layer 134 is formed of a silicon semiconductor, the semiconductor layer 134 may include, for example, amorphous silicon (a-Si) or low temperature poly-silicon (LTPS) obtained by crystallizing amorphous silicon (a-Si).

A first insulating layer 109 may be on the semiconductor layer 134. The first insulating layer 109 may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The first insulating layer 109 may include a single layer or multi-layer including the aforementioned inorganic insulating material.

The driving gate electrode 136 may be on the first insulating layer 109. The driving gate electrode 136 may include at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu) and may have a single-layered or multi-layered structure. The driving gate electrode 136 may be used as a top gate electrode of the first thin-film transistor.

The driving gate electrode 136 and the first electrode 139 may overlap each other with the semiconductor layer 134 therebetween.

A second insulating layer 111 may be on the driving gate electrode 136. The second insulating layer 111 may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The second insulating layer 111 may include a single layer or multi-layer including the aforementioned inorganic insulating material.

The storage capacitor Cst may be on the first insulating layer 109. The storage capacitor Cst may include a lower electrode 144, and an upper electrode 146 overlapping the lower electrode 144. The lower electrode 144 and the upper electrode 146 of the storage capacitor Cst may overlap each other with the second insulating layer 111 therebetween.

The lower electrode 144 of the storage capacitor Cst may overlap the driving gate electrode 136 of the first thin-film transistor, and may be integrally arranged with the driving gate electrode 136 of the first thin-film transistor. The storage capacitor Cst may overlap the first thin-film transistor. The present invention is not limited thereto. In an example embodiment, the storage capacitor Cst need not overlap the first thin-film transistor, and the lower electrode 144 of the storage capacitor Cst may be a component independent from the driving gate electrode 136 of the first thin-film transistor.

According to an embodiment, the driving source electrode 137 and the driving drain electrode 138 may be arranged on the first insulating layer 109 to be spaced apart from the upper electrode 146 of the storage capacitor Cst. Each of the driving source electrode 137 and the driving drain electrode 138 may include a conductive material including molybdenum (Mo), aluminum (Al), copper (Cu), or titanium (Ti), and may include a multi-layer or single layer including the aforementioned materials. Each of the source electrode 137 and the drain electrode 138 may have a multi-layer structure of Ti/Al/Ti.

According to another embodiment, an insulating layer may be on the upper electrode 146 of the storage capacitor Cst, and the driving source electrode 137 and the driving drain electrode 138 may be on the insulating layer.

A planarization layer 113 may be on the upper electrode 146 of the storage capacitor Cst. The planarization layer 113 may include a single layer including an organic or inorganic material or a multi-layer formed by stacking single layers including an organic or inorganic material. According to an embodiment, the planarization layer 113 may include a commercial polymer such as benzocyclobutene (BCB), polyimide (PI), hexamethyldisiloxane (HMDSO), polymethyl methacrylate (PMMA), or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like. The planarization layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. After the planarization layer 113 is formed, chemical and mechanical polishing may be performed to provide a flat upper surface.

The organic light-emitting diode OLED includes the pixel electrode 210, an intermediate layer 220, and an opposite electrode 230 and may be on the planarization layer 113. The pixel electrode 210 may be a (semi) light-transmissive electrode or a reflective electrode. The pixel electrode 210 may include a reflection layer including aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), or a compound thereof, and a transparent or semi-transparent electrode layer on the reflection layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). The pixel electrode 210 may have a stack structure of ITO/Ag/ITO.

A pixel defining layer 180 may be on the planarization layer 113. The pixel defining layer 180 may include an opening that exposes at least a portion of the pixel electrode 210. A region exposed by the opening of the pixel defining layer 180 may be defined as a light-emission region. The vicinity of light-emission regions is a non-light-emission region, and the non-light-emission region may surround the light-emission regions. In an example embodiment, the display area DA may include a plurality of light-emission regions and a non-light-emission region that surrounds the plurality of light-emission regions. The pixel defining layer 180 may prevent an arc from occurring on the edge of the pixel electrode 210 by increasing a distance between the pixel electrode 210 and the opposite electrode 230 over the pixel electrode 210. The pixel defining layer 180 may be formed of an organic insulating material, such as polyimide, polyamide, acryl resin, benzocyclobutene, hexamethyldisiloxane (HMDSO), or phenol resin, via spin coating or the like.

The intermediate layer 220 may be on the pixel electrode 210 of which at least a portion is exposed by the pixel defining layer 180. The intermediate layer 220 may include an emission layer 220b, and a first functional layer 220a and a second functional layer 220c may be selectively arranged below and above the emission layer 220b, respectively.

According to an embodiment, the intermediate layer 220 may be on the pixel electrode 210 of which at least a portion is exposed by the pixel defining layer 180. In more detail, the emission layer 220b of the intermediate layer 220 may be on the pixel electrode 210 of which at least a portion is exposed by the pixel defining layer 180.

The first functional layer 220a may be below the emission layer 220b, and the second functional layer 220c may be above the emission layer 220b. The first functional layer 220a and the second functional layer 220c below and above the emission layer 220b may be referred to as organic functional layers.

The first functional layer 220a may include a hole injection layer (HIL) and/or a hole transport layer (HTL), and the second functional layer 220c may include an electron transport layer (ETL) and/or an electron injection layer (EIL).

The emission layer 220*b* may include an organic material including a fluorescent or phosphorescent material that emits red, green, blue, or white light. The emission layer 220*b* may include a low-molecular weight organic material or a high-molecular weight organic material.

When the emission layer 220*b* includes a low molecular weight material, the intermediate layer 220 may be a stack of an HIL, an HTL, an emission layer, an ETL, and an EIL in a single structure or a composite structure, and may include, as the low molecular weight material, any of various materials including copper phthalocyanine (CuPc), N,N'-Di(naphthalene-1-yl)-N,N'-diphenyl-benzidine (NPB), or tris-8-hydroxyquinoline aluminum ($Alq_3$). These layers may be formed via vacuum deposition.

When the emission layer 220*b* includes a high-molecular weight material, the intermediate layer 220 may have a structure including an HTL and an emission layer. In this case, the HTL may include poly(ethylenedioxythiophene) (PEDOT), and the emission layer may include a high-molecular weight material such as a polyphenylene vinylene (PPV)-based material or a polyfluorene-based material. The emission layer may be formed via screen printing, inkjet printing, laser induced thermal imaging (LITI), or the like.

The opposite electrode 230 may be on the intermediate layer 220. The opposite electrode 230 may be on the intermediate layer 220 to entirely cover the intermediate layer 220. The opposite electrode 230 may be over the display area DA to entirely cover the display area DA. In an example embodiment, the opposite electrode 230 may be integrally formed over the entire display area to cover the plurality of pixels P arranged in the display area DA by using an open mask. According to another embodiment, the opposite electrode 230 may be patterned using a fine metal mask (FMM).

The opposite electrode 230 may include a conductive material having a low work function. For example, the opposite electrode 230 may include a (semi)transparent layer including, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca) or an alloy of these materials. Alternatively, the opposite electrode 230 may further include a layer, such as ITO, IZO, ZnO, or $In_2O_3$, on the (semi)transparent layer including any of the above-described materials.

According to an embodiment, the organic light-emitting diode OLED may be covered by a thin-film encapsulation layer. The thin-film encapsulation layer may include at least one inorganic encapsulation layer and at least one organic encapsulation layer. According to another embodiment, the organic light-emitting diode OLED may be covered by an encapsulation substrate.

Referring to FIGS. 3 and 5, the display apparatus 1 according to an embodiment may include a second thin-film transistor. The second thin-film transistor may be configured to transmit the data signal Dm to the first thin-film transistor according to the first scan signal Sn1 received via the first scan line SL1. For example, the second thin-film transistor may be the switching thin-film transistor T2 of FIG. 3.

The second thin-film transistor may include a switching gate electrode, a switching source electrode, and a switching drain electrode. The switching gate electrode of the second thin-film transistor may be connected to the first scan line SL1, the switching source electrode of the second thin-film transistor may be connected to the data line DL, and the switching drain electrode of the second thin-film transistor may be connected to the driving source electrode of the first thin-film transistor.

The second thin-film transistor may be turned on according to the first scan signal Sn1 and may transmit the data signal Dm transmitted through the data line DL to the driving source electrode of the first thin-film transistor.

The display apparatus 1 according to an embodiment may include a third thin-film transistor. The third thin-film transistor may be connected to the first electrode 139 included in the first thin-film transistor. The third thin-film transistor may be configured to transmit the first voltage to the first electrode 139 according to the second scan signal Sn2 received through the second scan line SL2. For example, the third thin-film transistor may be the second compensating thin-film transistor T3_2 of FIG. 3.

The first voltage transmitted to the first electrode 139 according to the second scan signal Sn2 received through the second scan line SL2 may be a voltage corresponding to a voltage difference between the data signal Dm and a threshold voltage of the first thin-film transistor.

Figure 6:
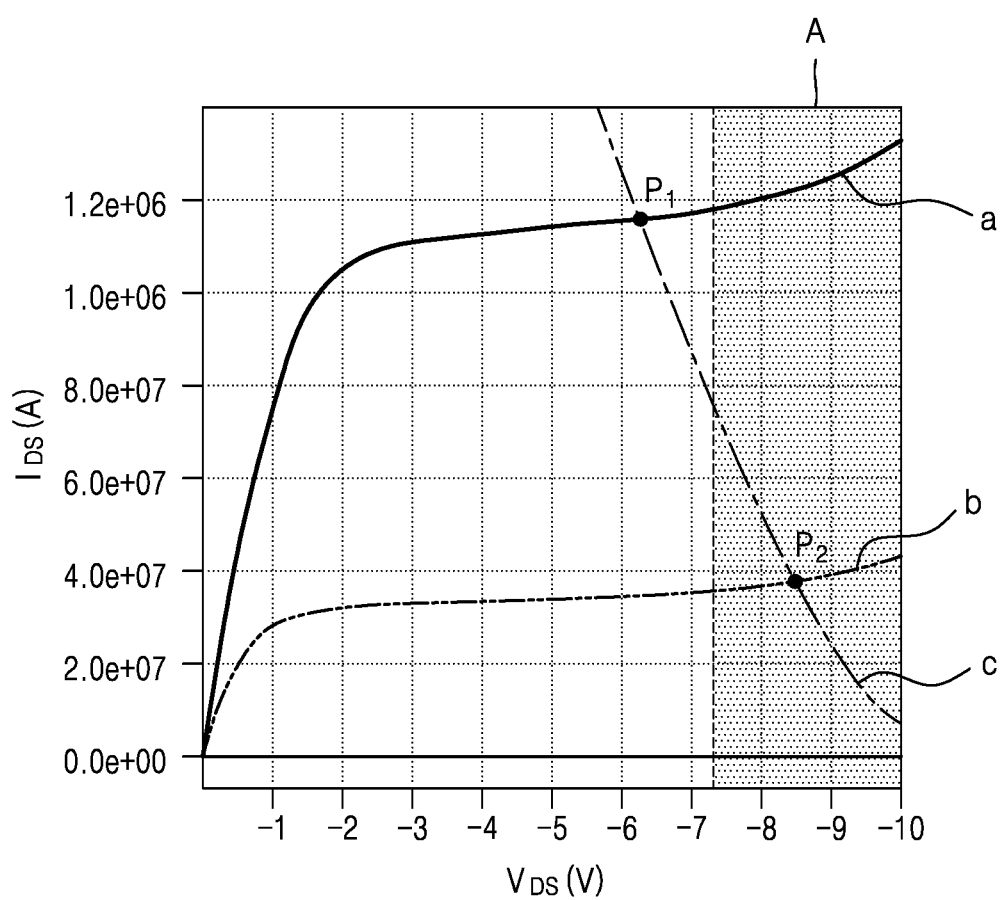
FIG. 6 is a graph for explaining generation of a bright defect at a low grayscale.

FIG. 6 is a graph for explaining generation of a bright defect at a low grayscale. Referring to FIG. 6, the curve a indicates a current-voltage curve of the driving thin-film transistor T1 at a high grayscale and an intermediate grayscale, the curve b indicates a current-voltage curve of the driving thin-film transistor T1 at the low grayscale, and the curve c indicates a current-voltage curve of the organic light-emitting diode OLED. A region A of FIG. 6 refers to a region where a kink effect occurs. The kink effect used herein refers to a sharp increase in a drain current due to a sharp increase in a charge.

In a high-luminance display apparatus which is implemented by increasing brightness per unit area of a light source, a first driving point $P_1$ may be formed in a region other than the region A where a kink effect occurs, at the high grayscale and the intermediate grayscale, and a second driving point $P_2$ may be formed in the region A where a kink effect occurs, at the low grayscale, as shown in FIG. 6. The first driving point P1 of the driving thin-film transistor T1 may correspond to a point where the current-voltage curve (e.g., the curve a) of the driving thin-film transistor T1 intersects the current-voltage curve (e.g., the curve c) of the organic light emitting diode OLED. The second driving point P2 of the driving thin-film transistor T1 may correspond to a point where the current-voltage curve (e.g., the curve b) of the driving thin-film transistor T1 intersects the current-voltage curve (e.g., the curve c) of the organic light emitting diode OLED. Because the second driving point $P_2$ is formed in the region A at the low grayscale, an image may be brighter than a normal image due to a kink effect.

Figure 7:
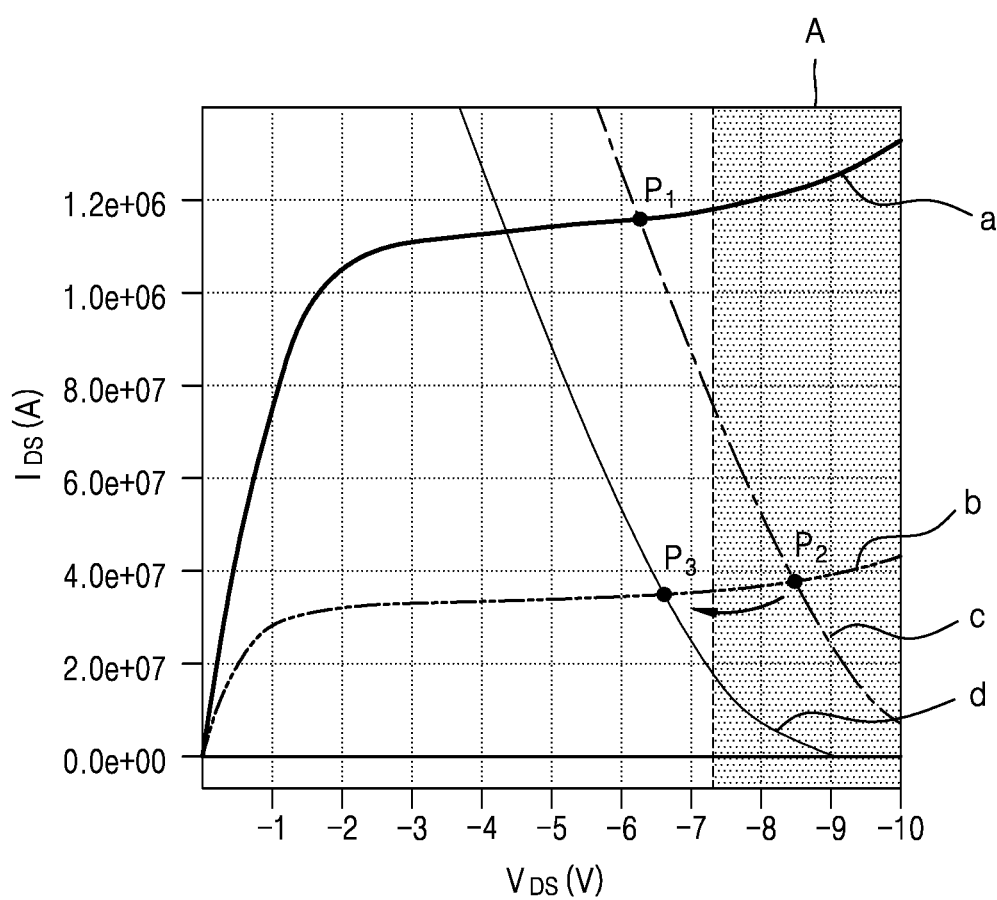
FIG. 7 is a graph showing current-voltage curves of a display apparatus according to an embodiment.

FIG. 7 is a graph showing current-voltage curves of a display apparatus according to an embodiment. Referring to FIG. 7, the curve a indicates a current-voltage curve of the driving thin-film transistor T1 at a high grayscale and an intermediate grayscale, the curve b indicates a current-voltage curve of the driving thin-film transistor T1 at a low grayscale, the curve c indicates a current-voltage curve of the organic light-emitting diode OLED at the high grayscale and the intermediate grayscale, and the curve d indicates a current-voltage curve of the organic light-emitting diode OLED at the low grayscale. A region A of FIG. 7 refers to a region where a kink effect occurs. The kink effect used herein refers to a sharp increase in a drain current due to a sharp increase in a charge.

Referring to FIGS. 3, 5, and 7, a first driving point $P_1$ may be formed in a region other than the region A where a kink effect occurs, at the high grayscale and the intermediate grayscale, and a third driving point $P_3$ may be formed in the region other than the region A where a kink effect occurs, even at the low grayscale, and thus generation of a bright defect may be prevented. The third driving point $P_3$ of the driving thin-film transistor T1 may correspond to a point where the current-voltage curve (e.g., the curve b) of the driving thin-film transistor T1 intersects the current-voltage curve (e.g., the curve d) of the organic light emitting diode OLED.

The display apparatus 1 according to an embodiment uses the first electrode 139 arranged below the semiconductor layer as the bottom gate electrode of the driving thin-film transistor T1 and applies a voltage corresponding to a voltage difference between the data signal Dm and the threshold voltage of the driving thin-film transistor T1 to the first electrode 139, thereby reducing Vd(sat) by minus-shifting the threshold voltage of the driving thin-film transistor T1. Vd(sat) may represent a voltage at the drain of the driving thin-film transistor T1 when operating at its saturation mode. The minus-shifting of the threshold voltage may refer to a threshold voltage shift to the negative side. Thus, even when a high-luminance display apparatus is implemented, generation of a bright defect due to a kink effect may be addressed, and at the same time panel characteristics of the high-luminance display apparatus may improve.

Referring back to FIGS. 3 and 5, the display apparatus 1 according to an embodiment may include a fourth thin-film transistor. The fourth thin-film transistor may be turned on according to the first scan signal Sn1 and may diode-connect the driving gate electrode 136 of the first thin-film transistor to the driving drain electrode 138. For example, the fourth thin-film transistor may be the first compensating thin-film transistor T3_1 of FIG. 3.

A first compensating gate electrode of the fourth thin-film transistor may be connected to the first scan line SL1, and a source electrode of the fourth thin-film transistor may be connected to a drain electrode of the first thin-film transistor and a source electrode of the third thin-film transistor. The fourth thin-film transistor and the third thin-film transistor may be electrically connected to each other.

Figure 8:
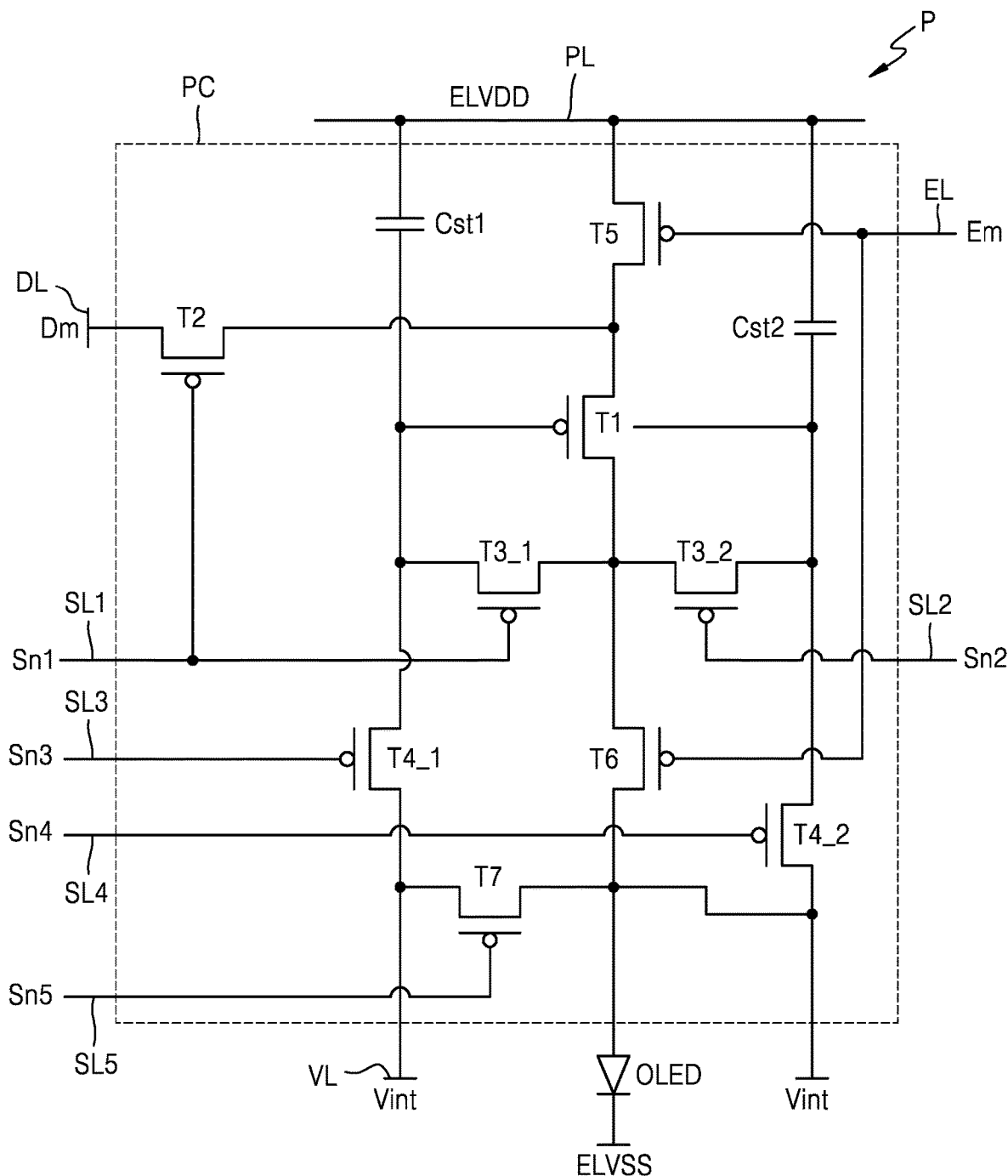
FIG. 8 is an equivalent circuit diagram of a pixel of a display apparatus according to an embodiment.
Figure 9:
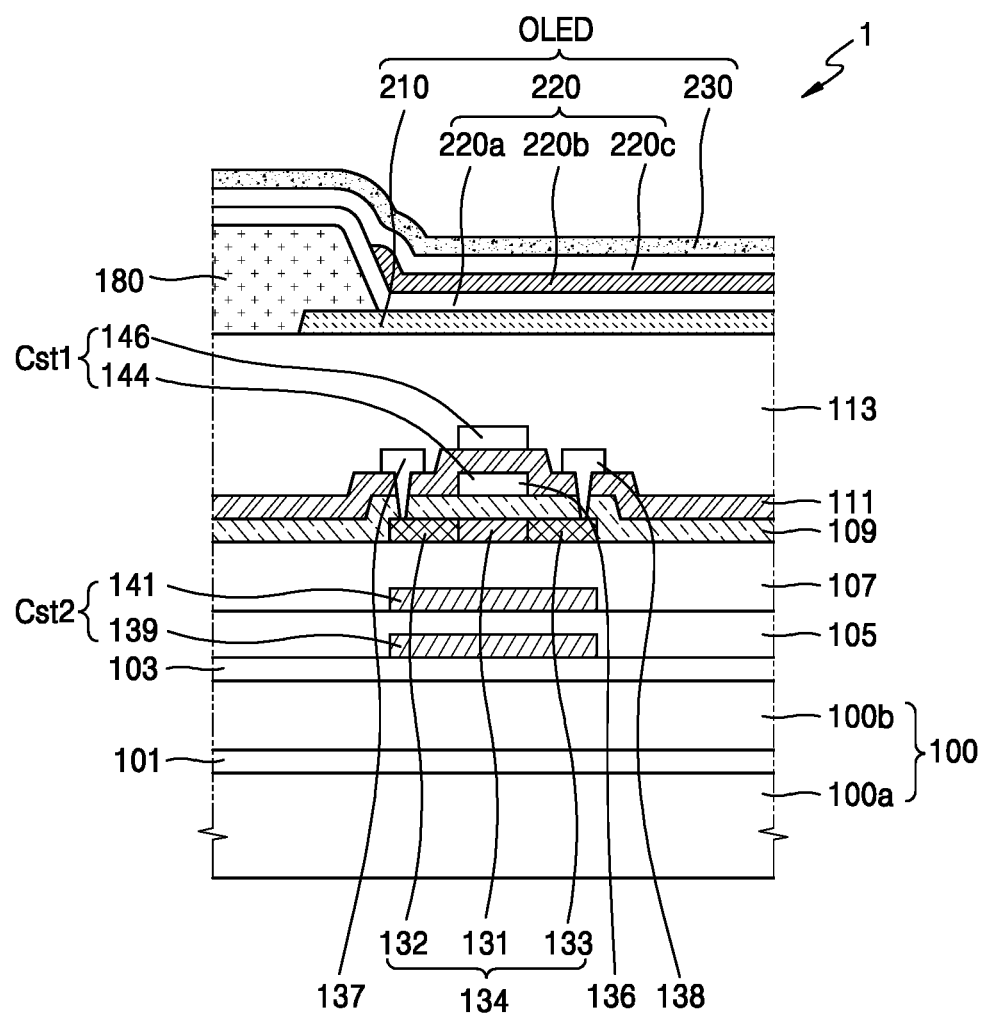
FIG. 9 is a schematic cross-sectional view of a display apparatus according to an embodiment.

FIG. 8 is an equivalent circuit diagram of a pixel of a display apparatus 1 according to an embodiment, and FIG. 9 is a schematic cross-sectional view of the display apparatus 1 according to an embodiment.

The embodiment of FIGS. 8 and 9 is a modification of the embodiment of FIGS. 3 and 5, and is different from the above-described embodiment in that a second electrode and a signal line are added. The difference therebetween will now be focused on and described. The other components are the same as or similar to those of the above-described embodiment.

Referring to FIGS. 8 and 9, a pixel circuit PC of the display apparatus 1 according to an embodiment may include a plurality of thin-film transistors T1 through T7 and a plurality of storage capacitors Cst1 and Cst2. The pixel circuit PC may include a driving thin-film transistor T1, a switching thin-film transistor T2, a first compensating thin-film transistor T3_1, a second compensating thin-film transistor T3_2, a first initializing thin-film transistor T4_1, a second initializing thin-film transistor T4_2, an operation control thin-film transistor T5, a light-emission control thin-film transistor T6, a third initializing thin-film transistor T7, a first storage capacitor Cst1, and the second storage capacitor Cst2.

A fourth scan line SL4 may be configured to transmit a fourth scan signal Sn4 to the second initializing thin-film transistor T4_2, and a fifth scan line SL5 may be configured to transmit a fifth scan signal Sn5 to the third initializing thin-film transistor T7.

A first upper electrode of the first storage capacitor Cst1 and a second upper electrode of the second storage capacitor Cst2 may be connected to a driving voltage line PL. A driving gate electrode of the driving thin-film transistor T1 may be connected to a first lower electrode of the first storage capacitor Cst1, and a second lower electrode of the second storage capacitor Cst2 may be connected to the first electrode 139 of the driving thin-film transistor T1 and the second compensating drain electrode of the second compensating thin-film transistor T3_2.

The display apparatus 1 according to an embodiment may further include a second electrode 141. The second electrode 141 may be arranged by overlapping at least a portion of the first electrode 139. The first buffer layer 105 may be disposed between the first electrode 139 and the second electrode 141. In an example embodiment, a portion of the first buffer layer 105 may be disposed between the first electrode 139 and the second electrode 141 such that a stack structure of the first electrode 139, the portion of the first buffer layer 105 and the second electrode 141 forms the second capacitor Cst2.

According to an embodiment, the driving gate electrode 136 and the lower electrode 144 may be integrally formed, and thus the driving gate electrode 136 and the upper electrode 146 may constitute the first storage capacitor Cst1. The first electrode 139 and the second electrode 141 may constitute the second storage capacitor Cst2. According to another embodiment, the driving gate electrode 136 and the lower electrode 144 may be independent components.

Because the first electrode 139 and the second electrode 141 constitute the second storage capacitor Cst2, the driving current $I_{OLED}$ may be supplied to the organic light-emitting diode OLED by using the driving gate electrode 136 corresponding to a top gate of the driving thin-film transistor T1 at the high grayscale and the intermediate grayscale, and a driving current $I_{OLED}$ may be supplied to the organic light-emitting diode OLED by using the first electrode 139 corresponding to a bottom gate of the driving thin-film transistor T1 at the low grayscale. Accordingly, even when a high-luminance display apparatus is implemented by minus-shifting the threshold voltage of the driving thin-film transistor T1, generation of a bright defect due to a kink effect may be addressed, and at the same time panel characteristics may improve.

According to an embodiment as described above, a display apparatus capable of preventing generation of a bright defect may be realized. Of course, the scope of the disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:
1. A display apparatus comprising:
    a first thin-film transistor including a semiconductor layer arranged on a substrate, a driving gate electrode arranged on the semiconductor layer, and a first electrode arranged between the substrate and the semiconductor layer;
a second thin-film transistor configured to transmit a data signal received through a data line to a source electrode of the first thin-film transistor according to a first scan signal received through a first scan line; and
a third thin-film transistor including a source electrode connected to a drain electrode of the first thin-film transistor and a drain electrode connected to the first electrode, wherein the third thin-film transistor is configured to transmit a first voltage of the drain electrode of the first thin-film transistor to the first electrode according to a second scan signal received through a second scan line.

2. The display apparatus of claim 1,
wherein the first voltage of the drain electrode of the first thin-film transistor is a voltage corresponding to a voltage difference between the data signal and a threshold voltage of the first thin-film transistor.

3. The display apparatus of claim 1,
wherein the driving gate electrode and the first electrode overlap each other with the semiconductor layer between the driving gate electrode and the first electrode.

4. The display apparatus of claim 3,
wherein the first electrode is connected to the third thin-film transistor.

5. The display apparatus of claim 1,
wherein the first thin-film transistor further includes a driving source electrode and a driving drain electrode, and the second thin-film transistor further includes a switching gate electrode, a switching source electrode, and a switching drain electrode.

6. The display apparatus of claim 5,
wherein the switching gate electrode of the second thin-film transistor is connected to the first scan line, the switching source electrode of the second thin-film transistor is connected to the data line, and the switching drain electrode of the second thin-film transistor is connected to the driving source electrode of the first thin-film transistor.

7. The display apparatus of claim 6,
wherein the second thin-film transistor is turned on according to the first scan signal and transmits the data signal received through the data line to the driving source electrode of the first thin-film transistor.

8. The display apparatus of claim 5, further comprising:
a fourth thin-film transistor turned on according to the first scan signal to diode-connect the driving gate electrode of the first thin-film transistor to the driving drain electrode of the first thin-film transistor.

9. The display apparatus of claim 8,
wherein the fourth thin-film transistor is connected to the third thin-film transistor.

10. The display apparatus of claim 1, further comprising:
a first storage capacitor including the driving gate electrode and an upper electrode overlapping the driving gate electrode with an insulating layer between the upper electrode and the driving gate electrode.

11. The display apparatus of claim 1, further comprising:
a second electrode interposed between the first electrode and the semiconductor layer of the first thin-film transistor.

12. The display apparatus of claim 11,
wherein the second electrode is spaced apart from the driving gate electrode.

13. The display apparatus of claim 11, further comprising:
a barrier layer arranged on the substrate; and
a buffer layer arranged on the barrier layer,
wherein the first electrode is directly on the barrier layer.

14. The display apparatus of claim 13,
wherein the buffer layer comprises:
a first buffer layer arranged on the barrier layer; and
a second buffer layer arranged on the first buffer layer, and
wherein the second electrode is directly on the first buffer layer.

15. The display apparatus of claim 14,
wherein the first electrode and the second electrode at least partially overlap each other.

16. The display apparatus of claim 15,
wherein a portion of the first buffer layer is interposed between the first electrode and the second electrode to form a second storage capacitor having the first electrode and the second electrode with the portion of the first buffer layer therebetween.

17. The display apparatus of claim 16,
wherein the second storage capacitor and the first thin-film transistor overlap each other.

18. The display apparatus of claim 14,
wherein the first buffer layer and the second buffer layer include different materials.

19. The display apparatus of claim 1,
wherein the substrate includes polyimide (PI).

20. A display apparatus comprising:
a first thin-film transistor including a semiconductor layer arranged on a substrate, a driving gate electrode arranged on the semiconductor layer, and a first electrode arranged between the substrate and the semiconductor layer;
a second thin-film transistor configured to transmit a data signal received through a data line to the first thin-film transistor according to a first scan signal received through a first scan line;
a third thin-film transistor configured to transmit a voltage corresponding to a voltage difference between the data signal and a threshold voltage of the first thin-film transistor to the first electrode according to a second scan signal received through a second scan line; and
an organic light-emitting diode electrically connected to the first thin-film transistor and including a pixel electrode, an intermediate layer, and an opposite electrode.

* * * * *